United States Patent [19]

Vidovic et al.

[11] 4,063,279

[45] Dec. 13, 1977

[54] SELF-TRACKING INJECTION LOCK VOLTAGE CONTROLLED OSCILLATOR

[75] Inventors: Nikola Vidovic, Santa Clara; Barrett E. Guisinger, Saratoga, both of Calif.

[73] Assignee: International Video Corporation, Sunnyvale, Calif.

[21] Appl. No.: 700,382

[22] Filed: June 28, 1976

[51] Int. Cl.² .......................... H04N 9/46; H04N 5/795
[52] U.S. Cl. ............................................. 358/19; 358/8; 331/1 R; 331/25
[58] Field of Search ............... 358/8, 17, 19; 331/1 R, 331/8, 20, 25, 18

[56] References Cited
U.S. PATENT DOCUMENTS 3,733,432   5/1973   Arimura et al. ........................ 358/8

Primary Examiner—Robert L. Richardson
Attorney, Agent, or Firm—Limbach, Limbach & Sutton

[57] ABSTRACT

Apparatus, including an injection lock and voltage controlled oscillator, generates a signal that follows the average frequency variations and instantaneous phase variations of a repetitive non-continuous signal. The oscillator injection lock input receives the repetitive signal and its DC control input receives an error signal generated in an AFC loop which derives the difference between the oscillator output and the repetitive signal average frequency. In one particular application, the apparatus is useful in a color television signal processing or reproducing system for generating a television color subcarrier signal. The apparatus is further disclosed in connection with a demodulation-remodulation type color corrector in a video reproducing system.

8 Claims, 8 Drawing Figures (FIG. 2)

SELF-TRACKING INJECTION LOCK VOLTAGE CONTROLLED OSCILLATOR

BACKGROUND OF THE INVENTION

The invention relates generally to oscillators and more particularly to oscillators providing a substantially continuous output signal that tracks the frequency and phase of a repetitive non-continuous input signal.

One particular environment in which such as oscillator is useful is in color television apparatus where a color subcarrier signal is required that follows the frequency and phase of the color burst signal, which is typically about eight cycles of a signal at the color subcarrier frequency repeating at the television signal horizontal line rate.

In so-called "color correctors" in color television recording and reproducing systems (video tape and disc recorders, for example), the raw, unprocessed reproduced or "off-tape" composite color television signal has an unstable chroma portion that causes visible color errors in the produced picture if left uncorrected. The degree of instability is greatest in less expensive video tape recorders in which no capstan servo control system is employed.

In highly sophisticated video tape recorder systems, elaborate techniques are used to stabilize the reproduced video signal. For example, time base correction using both analog and digital techniques are well-known. Also velocity compensation is well-known is sophisticated systems for correcting errors that change through a single horizontal television line.

Color correctors, on the other hand, have been used in less sophisticated video tape recorders or for playback monitor purposes in the sophisticated machines where greater phase error and phase jitter can be tolerated in a trade-off against the cost of full color correction by time base correction and velocity compensation.

A typical color corrector uses the demodulation-remodulation technique: the chroma portion of the off-tape video signal is demodulated into its R-Y and B-Y components using a continuous subcarrier derived from the off-tape color burst using a phase lock loop. The demodulated R-Y and B-Y components are applied to a modulator having a stable subcarrier signal reference, as from a crystal oscillator, to provide a stabilized chroma signal.

One problem with such a color corrector using a phase lock loop is that the loop speed cannot be optimized to follow the fast phase changes of the off-tape color burst. Consequently, substantial phase errors are uncorrected in the remodulated chroma signal and line-by-line correction is not achieved.

Another approach has been to use a start-stop oscillator in place of the phase lock loop in the color corrector to achieve greater speed. Although initial phasing is achieved, the oscillator frequency wanders by the end of the line, causing hue shifts in the reproduced picture.

SUMMARY OF THE INVENTION

In accordance with the teachings of the present invention, an oscillator is provided which provides a substantially continuous output signal having a phase that substantially instantaneously tracks the phase of a repetitive input signal and which tracks the average frequency of the input signal.

The inventive oscillator is both injection locked and voltage controlled. Rapid phase tracking to the repetitive input signal is achieved by injection locking the oscillator to the input signal phase. An automatic frequency control (AFC) loop provides a DC error signal to the voltage control input of the oscillator. The DC error signal is generated, deriving a signal representing the difference in frequency between the average frequency of the repetitive input signal and the oscillator output frequency.

In the context of a video reproducing system, such as a video tape or disc recorder, the AFC loop maintains the oscillator color subcarrier frequency at the average off-tape burst frequency during each line, thus avoiding hue shifts. On the other hand, changes in color burst phase from line to line are readily accommodated by rapidly injection locking the oscillator to the new burst phase during the burst time.

Generation of the frequency difference error signal is facilitated by employing a single frequency discriminator receiving the input signal and the oscillator output signal followed by a clamping and sample and hold circuit. Inaccuracies and other problems of matching frequency discriminators are avoided by this arrangement.

These and other advantages and features of the invention will be understood in greater detail as the following dsscription is read in conjunction with the drawings.

DESCRIPTION OF THE PREFERRED EMBODIMENT

Figure 1:
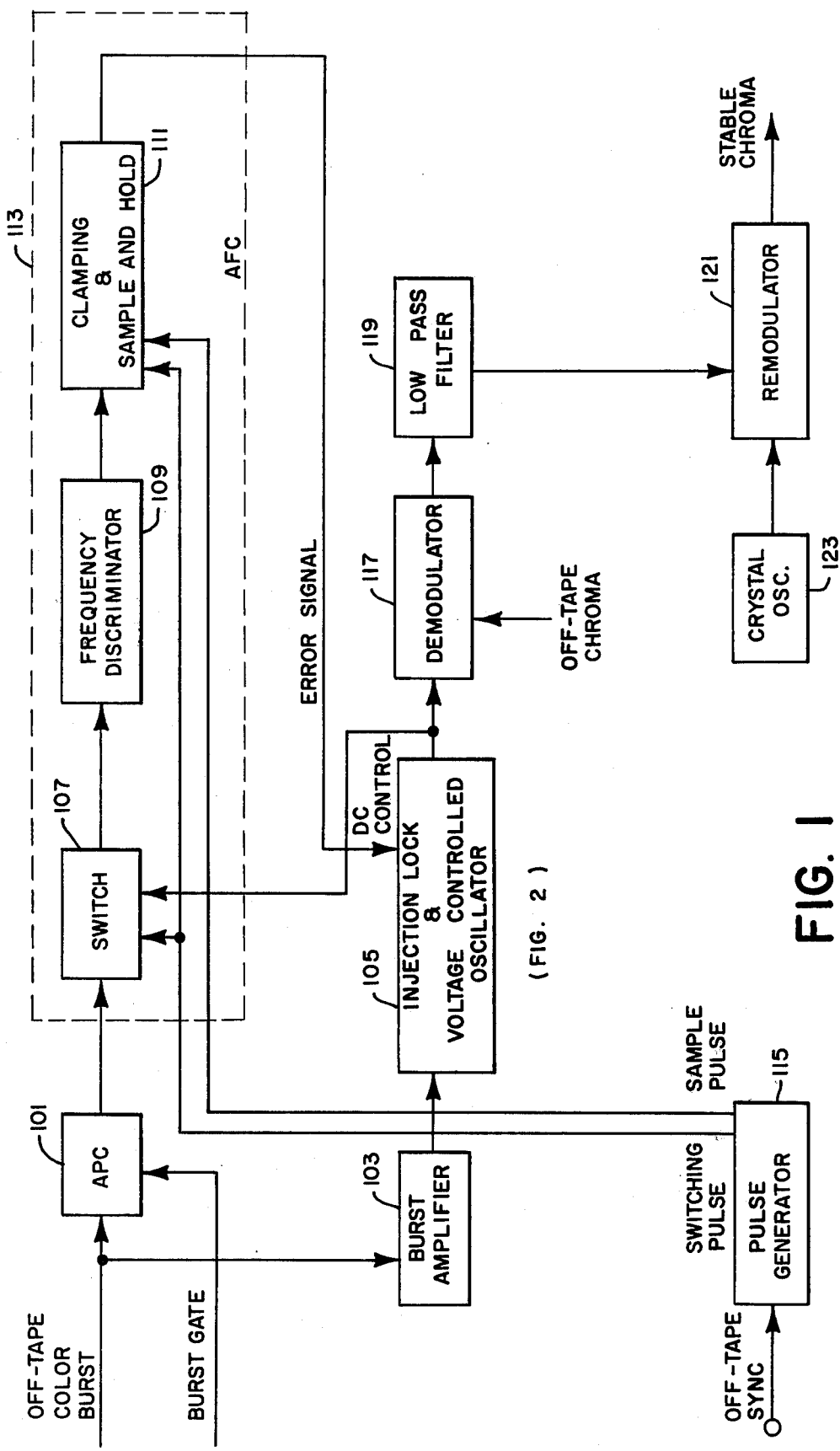
FIG. 1 is a block diagram of a preferred embodiment of the self-tracking injection lock voltage controlled oscillator shown in the context of a video reproducing system color corrector.
Figure 3:
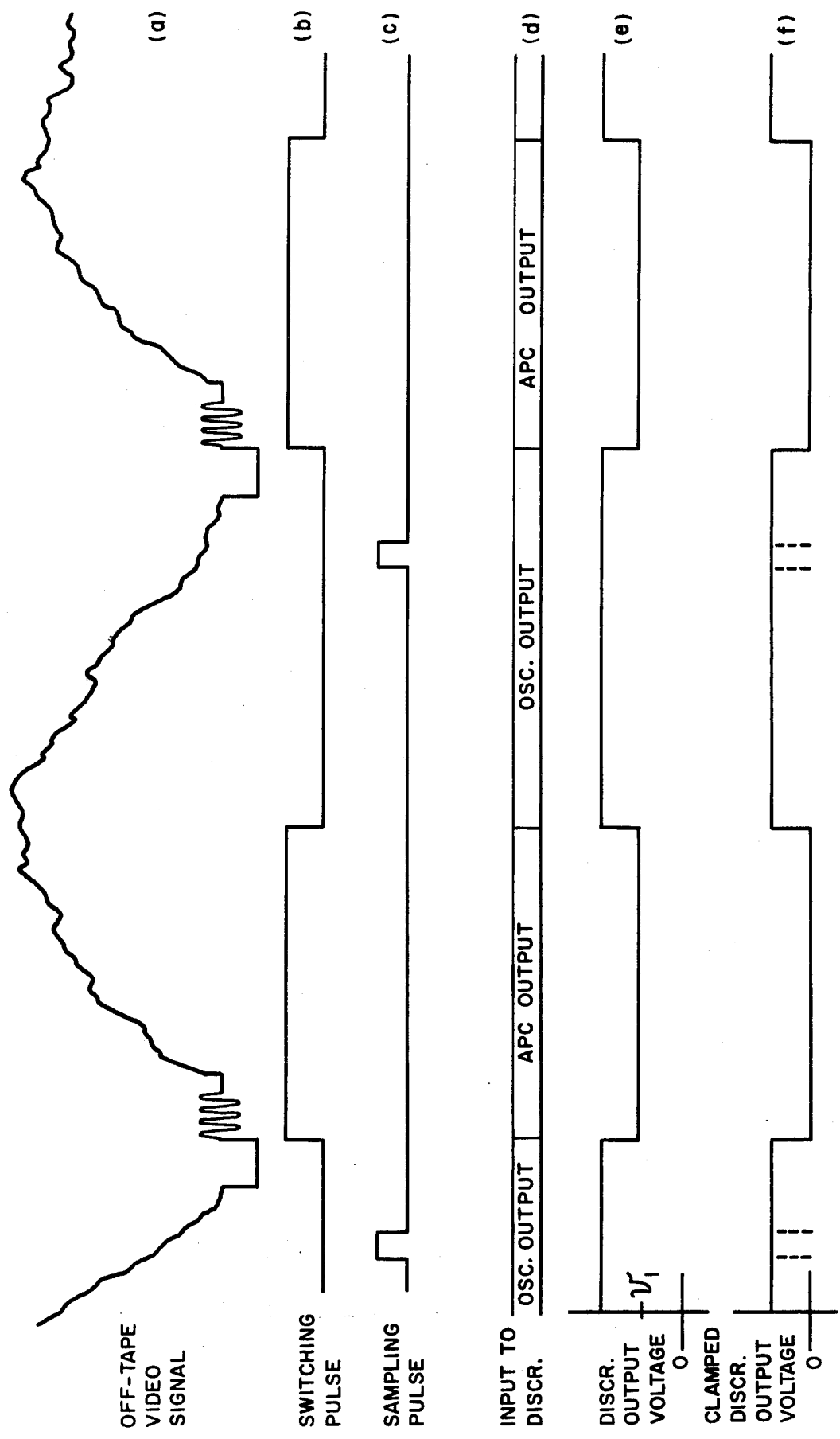
FIG. 3 (a–f) is a series of waveforms useful in understanding the operation of the preferred embodiment of FIG. 1.

Referring now to the drawings and particularly to FIGS. 1 and 3, a repetitive non-continuous signal, such as a television color burst signal is applied to an APC circuit 101. In the environment of a video tape recorder, the signal applied to block 101 is typically the off-tape color burst. APC 101 is a conventional automatic phase control circuit which is well-known in the art and which constitutes a means for generating a signal corresponding to the average frequency of the signal applied to it. Such circuits are also often referred to as automatic frequency control or AFC circuits. APC 101 also receives a gating signal at the time of the color burst. This "burst gate" is a signal typically available in color television apparatus, particularly in video tape recorders. APC 101 is a relatively slow loop device which generates the average frequency of the off-tape color burst within every television field, for example. In general, its speed is faster than the loop time of a capstan servo in video tape recorders which employ such servo mechanisms.

The off-tape color burst is also applied to a burst amplifier 103 which provides suitable level and impedance matching for the injection lock input to the injection lock and voltage controlled oscillator 105. The output of block 103 is the applied injection lock signal to oscillator 105. A switch 107, a frequency discriminator 109 and a clamping and sample and hold circuit 111 constitute an AFC loop 113 for generating an error signal which is the applied DC control signal to oscillator 105. A pulse generator 115 has a switching pulse output that is applied to switch 107 and to clamping and sample and hold circuit 111 and a sample pulse output that is applied only to the clamping and sample and hold circuit 111. Pulse generator 115 receives the off-tape sync signals and repetitively generates a switching pulse and a sample pulse delayed in time from the switching pulse.

Switch 107 constitutes a switching means which receives both the oscillator output signal from block 105 and the average frequency of the input signal from block 101. Upon receipt of the positive going switching pulse, shown in FIG. 3B, the switch 107 provides the oscillator output signal to the input of the frequency discriminator 109. In the absence of the switching pulse, the output of the APC 101 is applied to the frequency discriminator 109. FIG. 3D shows the sequence of inputs to discriminator 109. Frequency discriminator 109 constituting a means for frequency discriminating the signals received at its input can be a conventional single-tuned circuit discriminator, for example. The output of discriminator 109 is a voltage proportional to the frequency of the signal applied to its input, as is well-known.

Clamping and sample and hold means 111 is conventional and clamps the input signal to a reference level when it receives the positive-going switching pulse. For example, if the frequency discriminator output voltage is as shown in FIG. 3E with the lower level signal being at a voltage $v_1$, then the clamping action, shown in FIG. 3F, clamps the voltage level $v_1$ to the level 0 volts, for example. The sample pulse of FIG. 3C then samples the clamped discriminator output voltage, as indicated by the dotted lines in FIG. 3F. The sampled voltage level is then held as a constant output voltage as the error signal until the next sample time. By clamping one of the discriminator output levels to a known voltage, such as 0 volts, the other discriminator output level can be easily sampled to provide a voltage level indicating the difference between the two discriminator output voltages. Since the same frequency discriminator is used and since no analog subtractor is required, the derived error signal is very accurate.

As an alternative, two separate discriminators could be used, however, they would have to be matched very accurately. In the event two discriminators were used, the switch 107 and the clamping and sample and hold 111 could be eliminated and the outputs of the discriminators could be applied to an analog subtractor.

Pulse generator 115 is of conventional design and generates the switching and sample pulses from the off-tape sync signals. FIG. 3A shows an exemplary off-tape video signal having horizontal sync pulses and color bursts. The switching pulse follows the horizontal pulses and lasts for roughly one-half horizontal line. The sampling pulse occurs near the end of the horizontal line. The switching pulses should be of sufficient duration so that transients settle down.

Figure 2:
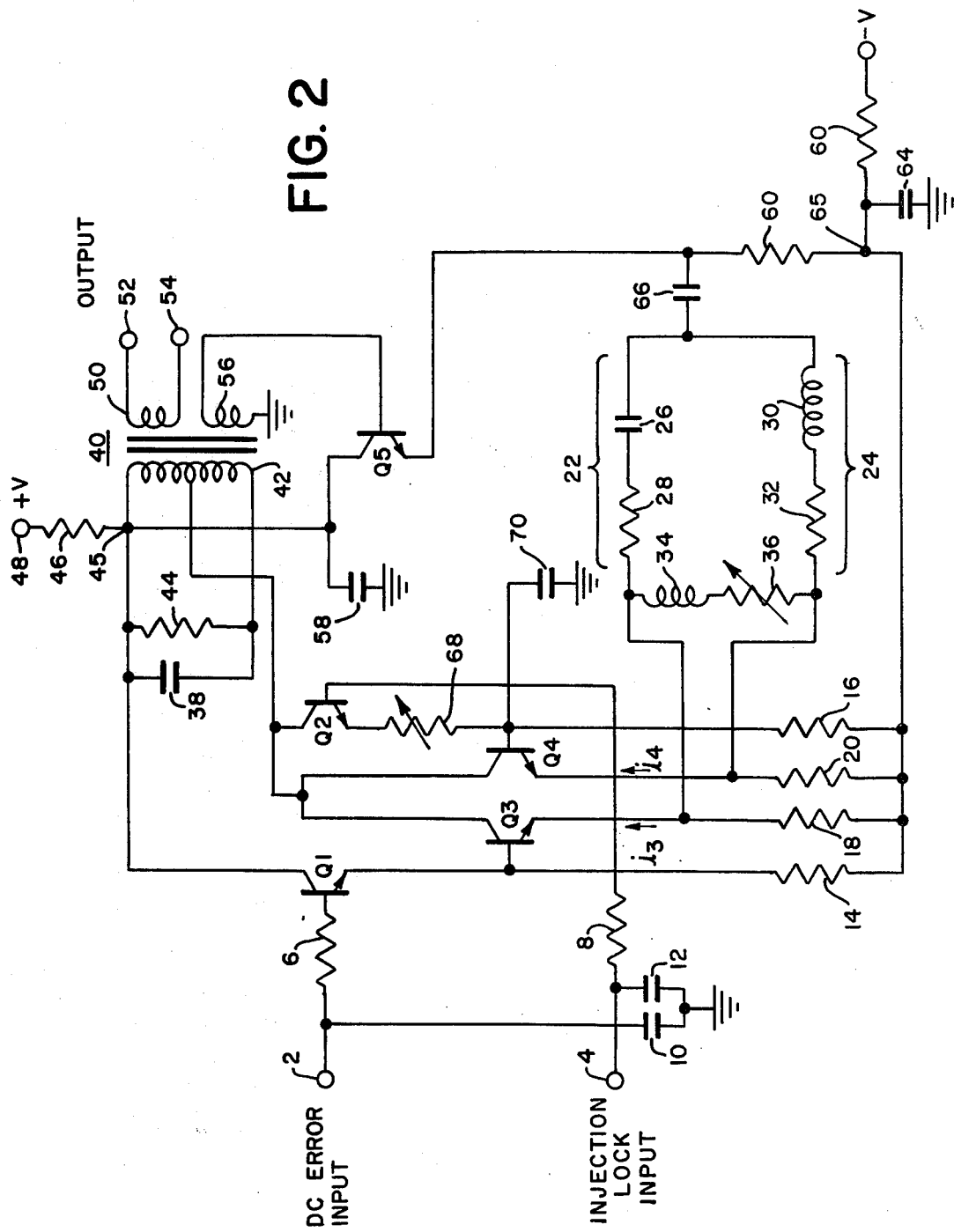
FIG. 2 is a schematic diagram of an injection lock voltage control oscillator usable in preferred embodiment of FIG. 1.

Details of the oscillator 105 are shown in FIG. 2. The oscillator ouput signal is a continuous television color subcarrier in the environment of a television reproducing system and is applied to a demodulator 117. The demodulator also receives the reproduced composite color television signal chroma portion or "off-tape chroma". In actual practice, the demodulator 117 includes two demodulators for the two quadrature components of the color signal. The demodulator 117 output is applied to a low pass filter 119 to remove any spurious high frequency components and the filtered signal is applied to a remodulator 121, which also receives a stable color subcarrier signal from a crystal oscillator 123, for example. The output of the remodulator 121 is a stable composite color television signal chroma portion.

Referring now to FIG. 2, the details of oscillator 105 are shown in circuit diagram form. The circuit is basically the same circuit disclosed and described in U.S. Pat. No. 3,686,587, patented Aug. 22, 1972, inventor, Bert H. Dann, and assigned to the assignee of the present application. Said patent is incorporated by reference herewith in its entirety.

Reference to FIG. 1 of the patent will show a few changes in the circuit. First, a potentiometer 68 has been inserted in the emitter lead of transistor Q2. Second, the collector of transistor Q2 has been lifted from junction 45 and instead connected to the collectors of transistors Q3 and Q4. Third, a bypass capacitor 70 has been connected to the base of transistor Q4, and fourth, the input 2 has now been designated the DC error input and the input 4 is the injection lock input as a result of the circuit modifications.

In operation, transistor Q2 acts as a current source controlled by the injection lock input at terminal 4. The variable resistor 68 and the emitter Q2 controls the injection current level and may be a fixed resistor once the optimum value is found, which depends on the level of the injection lock input signal. The bypass capacitor 70 removes any AC signals from the base of Q4 and prevents the injection lock input (or color burst in the television apparatus application of the invention) from frequency modulating the oscillator output.

Alternately, other types of voltage controlled oscillators having injection lock inputs can be substituted for the preferred circuit of FIG. 2. Also, a start-stop oscillator may be employed in place of the circuit of FIG. 2 so long as the oscillator has a voltage control input to which the error signal may be applied to prevent drifting of the oscillator frequency during the time period between the periodic signal inputs to the injection lock input.

The preferred embodiment of the invention thus described has been found to provide a line-by-line color correction in a video tape recorder reproducing system with immediate locking of the oscillator to the phase of off-tape color bursts during the time of the color burst with no drifting of the oscillator frequency between color burst. Approximately a 2 to 1 improvement in phase error in the reproduced video signal has been achieved in comparison to the type of color corrector described which uses a phase lock loop. In comparison. to sophisticated systems using full time base correction and velocity compensation, approximately only a 30% worse phase jitter is achieved, using the color corrector of the present invention.

It will be apparent to those of ordinary skill in the art that various modifications may be made to the preferred embodiment thus described without departing from the spirit of the invention. The scope of the invention is, therefore, to be limited only by the appended claims.

We claim:

1. Apparatus for generating a signal that follows the frequency and phase variations of a repetitive non-continuous signal comprising injection lock and voltage controlled oscillator means for generating an oscillator output signal having a phase responsive substantially instantaneously to the phase of an applied injection lock signal and a frequency responsive to an applied DC control signal, means for generating a siganl corresponding to the average frequency of said repetitive non-continuous signal, automatic frequency control loop means receiving said average frequency signal and said oscillator output signal for generating an error signal corresponding to the difference in frequency between said average frequency signal and said oscillator output signal and for applying said error signal to said oscillator means as the applied DC control signal, and means for applying said non-continuous signal to said oscillator means as the applied injection lock signal.

2. The combination of claim 1 wherein said automatic frequency control loop means comprises switching means receiving said average frequency signal and said oscillator output signal for providing said oscillator output signal as its output when a switching pulse is applied to said switching means and for providing said average frequency signal as its output when a switching pulse is not applied to said switching means, frequency discriminator means receiving the average frequency and oscillator output signals from said switching means for frequency discriminating said signals to provide signals having amplitudes proportional to their frequencies, clamping and sample and hold means receiving the output from said frequency discriminator means for clamping the discriminator means output when a switching pulse is applied to said clamping and sample and hold means to clamp said oscillator output signal amplitude to a predetermined level and for sampling the unclamped discriminator means output when said switching pulse is not applied to derive the absolute value of said difference frequency as said error signal when a sample pulse is applied, means for repetitively generating a switching pulse and for applying said switching pulse to said switching means and to said clamping and sample and hold means, and for repetitively generating a sample pulse delayed in time from said switching pulse and for applying said sample pulse to said clamping and sample and hold means.

3. In a color television signal reproducing system wherein a reproduced composite color television signal is processed, apparatus for generating a television color subcarrier signal that follows the frequency and phase variations of a repetitive non-continuous television color burst signal of said composite color television signal comprising injection lock and voltage controlled oscillator means for generating said color subcarrier signal having a phase locking to the phase of an applied injection lock signal within the time period of said color burst and a frequency responsive to an applied DC control signal, means for generating a signal corresponding to the average frequency of said color burst signal, automatic frequency control loop means receiving said color burst average frequency signal and said color subcarrier signal for generating an error signal corresponding to the difference in frequency between said color burst average frequency signal and said color subcarrier signal and for applying said error signal to said oscillator means as the applied DC control signal, and means for applying said color burst signal to said oscillator means as the applied injection lock signal.

4. The combination of claim 3 wherein said automatic frequency control loop means comprises switching means receiving said color burst average frequency signal and said color subcarrier signal for providing said color subcarrier signal as its output when a switching pulse is applied to said switching means and for providing said color burst average frequency signal as its output when a switching pulse is not applied to said switching means, frequency discriminator means receiving said color burst average frequency signal and said color subcarrier signals from said switching means for frequency discriminating said signals to provide signals having amplitudes proportional to their frequencies, clamping and sample and hold means receiving the output from said frequency discriminator means for clamping the discriminator means output when a switching pulse is applied to said clamping and sample and hold means and for sampling the unclamped discriminator means output when said switching pulse is not applied to derive the absolute value of said difference frequency as said error signal when a sample pulse is applied, means for repetitively generating a switching pulse and for applying said switching pulse to said switching means and to said clamping and sample and hold means, and for repetitively generating a sample pulse delayed in time from said switching pulse and for applying said sample pulse to said clamping and sample and hold means.

5. The combination of claim 4 wherein said sample pulse means generates a sample pulse subsequent to each switching pulse and before each next occurring switching pulse.

6. In a color television signal reproducing system wherein a reproduced composite color television signal is processed, apparatus for stabilizing the chroma portion of said reproduced composite color television signal comprising injection lock and voltage controlled oscillator means for generating a color subcarrier signal having a phase locking to the phase of an applied injection lock signal within the time period of said color burst and a frequency responsive to an applied DC control signal, means for generating a signal corresponding to the average frequency of the reproduced composite color television signal color burst, automatic frequency control loop means receiving said color burst average frequency signal and said color subcarrier signal for generating an error signal corresponding to the difference in frequency between said color burst average frequency signal and color subcarrier signal and for applying said error signal to said oscillator means as the applied DC control signal, demodulator means receiving said color subcarrier signal and the reproduced composite color television signal chroma portion for providing the demodulated color information in said reproduced composite color television signal chroma portion, means for generating a stable color subcarrier signal, and remodulator means receiving said demodulated color information and said stable color subcarrier signal for generating a stabilized composite color television signal chroma portion.

7. The combination of claim 6 wherein said automatic frequency control loop means comprises switching means receiving said color burst average frequency signal and said color subcarrier signal for providing said color subcarrier signal as its output when a switching pulse is applied to said switching means and for providing said color burst average frequency signal as its output when a switching pulse is not applied to said switching means, frequency discriminator means receiving said color burst average frequency signal and said color subcarrier signals from said switching means for frequency discriminating said signals to provide signals having amplitudes proportional to their frequencies, clamping and sample and hold means receiving the output from said frequency discriminator means for clamping the discriminator means output when a switching pulse is applied to said clamping and sample and hold means and for sampling the unclamped discriminator means output when said switching pulse is not applied to derive the absolute value of said difference frequency as said error signal when a sample pulse is applied, means for repetitively generating a switching pulse and for applying said switching pulse to said switching means and to said clamping and sample and hold means, and for repetitively generating a sample pulse delayed in time from said switching pulse and for applying said sample pulse to said clamping and sample and hold means.

8. The combination of claim 7 wherein said sample pulse means generates a sample pulse subsequent to each switching pulse and before each next occurring switching pulse.

* * * * *